United States Patent
Wu et al.

(10) Patent No.: US 6,698,992 B2
(45) Date of Patent: Mar. 2, 2004

(54) ELASTICALLY EXPANDABLE POSITIONING DEVICE

(75) Inventors: Kung Chris Wu, Sunnyvale, CA (US); Torben J. Ulander, Sunnyvale, CA (US); Chawshiang Wu, Hsin-Chu (TW); John Rush, Mountain View, CA (US)

(73) Assignee: Fortrend Taiwan Scientific Corp., Hsin-Chu (TW)

( * ) Notice: Subject to any disclaimer, the term of this patent is extended or adjusted under 35 U.S.C. 154(b) by 34 days.

(21) Appl. No.: 10/234,513

(22) Filed: Sep. 5, 2002

(65) Prior Publication Data

US 2003/0049102 A1 Mar. 13, 2003

(30) Foreign Application Priority Data

Sep. 13, 2001 (TW) .......................................... 90215829

(51) Int. Cl.[7] .................................................. B65F 3/02
(52) U.S. Cl. ..................... 414/217.1; 414/939; 414/411
(58) Field of Search ......................... 141/98; 414/217.1, 414/407, 411, 416.01–416.12, 939

(56) References Cited

U.S. PATENT DOCUMENTS 6,138,721 A * 10/2000 Bonora et al. ................. 141/98
6,398,475 B1 * 6/2002 Ishikawa ..................... 414/217
2002/0015636 A1 * 2/2002 Lee et al. .................... 414/407
2003/0012625 A1 * 1/2003 Rosenquist .............. 414/217.1
2003/0206795 A1 * 11/2003 Mages et al. ................ 414/808

FOREIGN PATENT DOCUMENTS

GB 2350878 A * 12/2002 ........... F16D/01/09

* cited by examiner

Primary Examiner—Christopher P. Ellis
Assistant Examiner—Mark A. Deuble
(74) Attorney, Agent, or Firm—Bacon & Thomas, PLLC

(57) ABSTRACT

An elastically expandable positioning device for positioning a cover of a unified pod is disclosed, which has a central fastener having one end protruded on the interface plate and an axial input hole opened at another end, and at least one radial distributing hole equally opened at its circular surface; a ring-shaped inflatable body made from an expandable elastic material; a supporting ring encircled around the central bolt and positioned above the distributing hole, for supporting the inflatable body, the supporting ring having at least one radial inflating hole equally positioned corresponding to the radial distributing hole of the central bolt; and an input fluid source connected to the axial input hole of the central bolt, for providing an input fluid.

9 Claims, 2 Drawing Sheets

ELASTICALLY EXPANDABLE POSITIONING DEVICE

BACKGROUND OF THE INVENTION

1. Field of the Invention

The present invention relates to a positioning device and, more particularly, to an elastically expandable positioning device for positioning a cover of a unified pod during the semiconductor wafer process.

2. Description of Related Art

A gate of a common unified pod loading system has an opening device to open the cover of the unified pod, and two positioning pins positioned at the positions corresponding to two positioning holes on the cover of the unified pod. Therefore, during the opening process, the positioning pins and the positioning holes both assist to position the cover. Prior art design of the positioning device is simply a column-shaped positioning pin. However, due to the consideration of the unified pod manufacturing process, the diameter of said two positioning holes is usually greater 0.5 mm than the diameter of said two positioning pins, which causes the outcome of the position is not satisfied. Consequently, during the opening process the obliquity will occur easily, and then the friction between the cover and the unified pod body will generate powder which causes even more serious abrasion and pollution.

SUMMARY OF THE INVENTION

The object of the present invention is to provide an elastically expandable positioning device, which can reduce the obliquity and the abrasion powder between the cover and the unified pod body.

To achieve the object, the positioning device of the present invention includes a central fastener having one end protruded on the interface plate, the central bolt further having an axial input hole opened at another end, and at least one radial distributing hole equally opened at the circular surface;

- a ring-shaped inflatable body made from an expandable elastic material;
- a supporting ring encircled around the central bolt and positioned above the distributing hole, for supporting the inflatable body, the supporting ring having at least one radial inflating hole equally positioned corresponding to the radial distributing hole of the central bolt; and
- an input fluid source connected to the axial input hole of the central bolt, for providing an input fluid.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
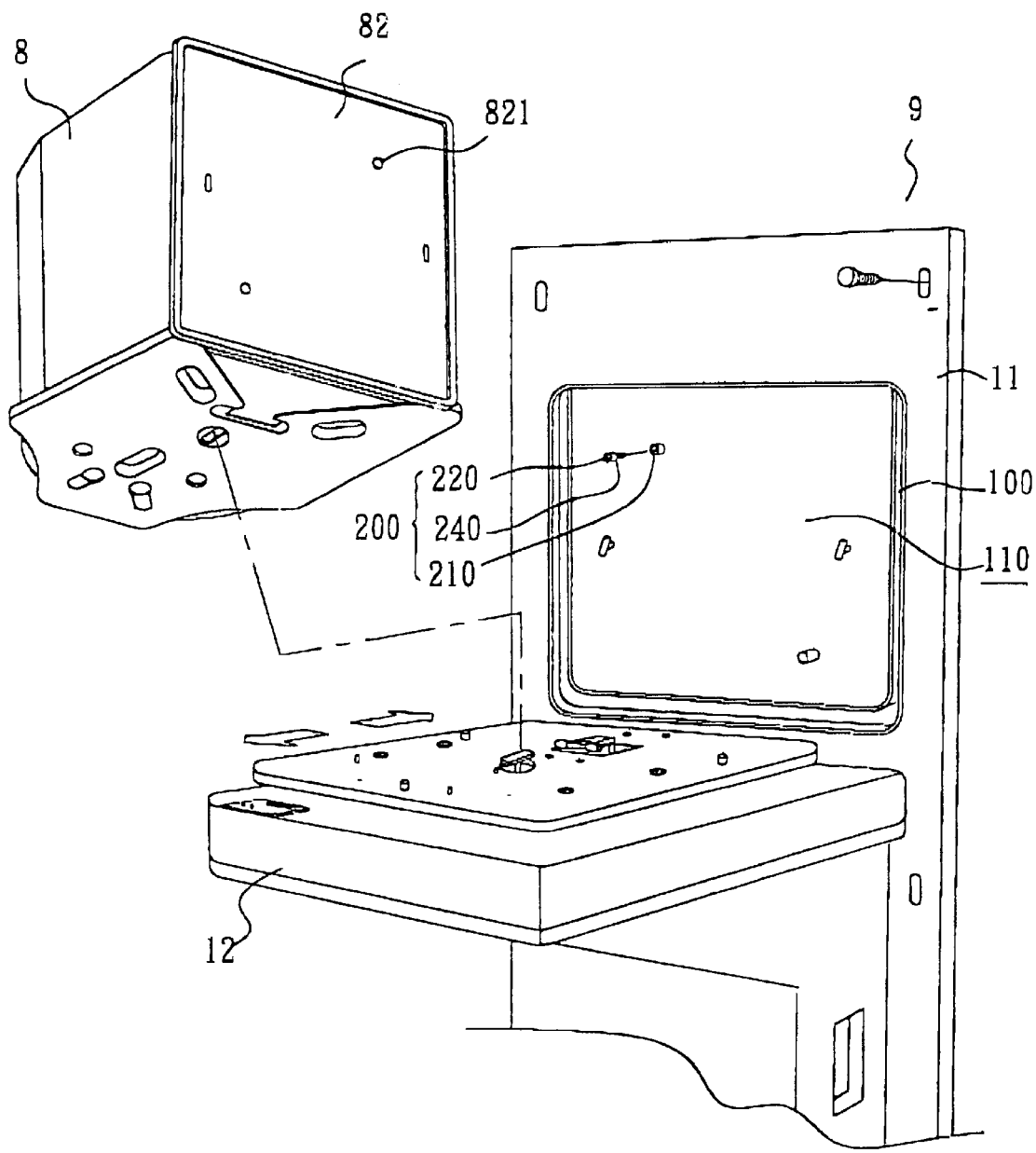
FIG. 1 is a schematic drawing of a unified pod and a loading system.

Please refer to FIG. 1. FIG. 1 is a schematic drawing of a unified pod and a unified pod loading system. A unified pod loading structure 9 is adapted to load and open/close a FOUP 8. The loading structure 9 comprises a backboard 11 fixedly fastened to a corresponding assembling side. The backboard 11 has a table 12 transversely disposed on the middle. An access 100 disposed on the upper side of the backboard 11 above the table 12, and an interface plate 110 fitting the access 100 of the backboard 11 and placed in the access 100. A positioning device 200 is protruded on the interface plate 110 of the unified pod loading system 9, for inserting into a corresponding positioning hole 821 on the cover 82 of the unified pod 8, to lock the unified pod 8 and the interface plate 110 together.

Figure 2:
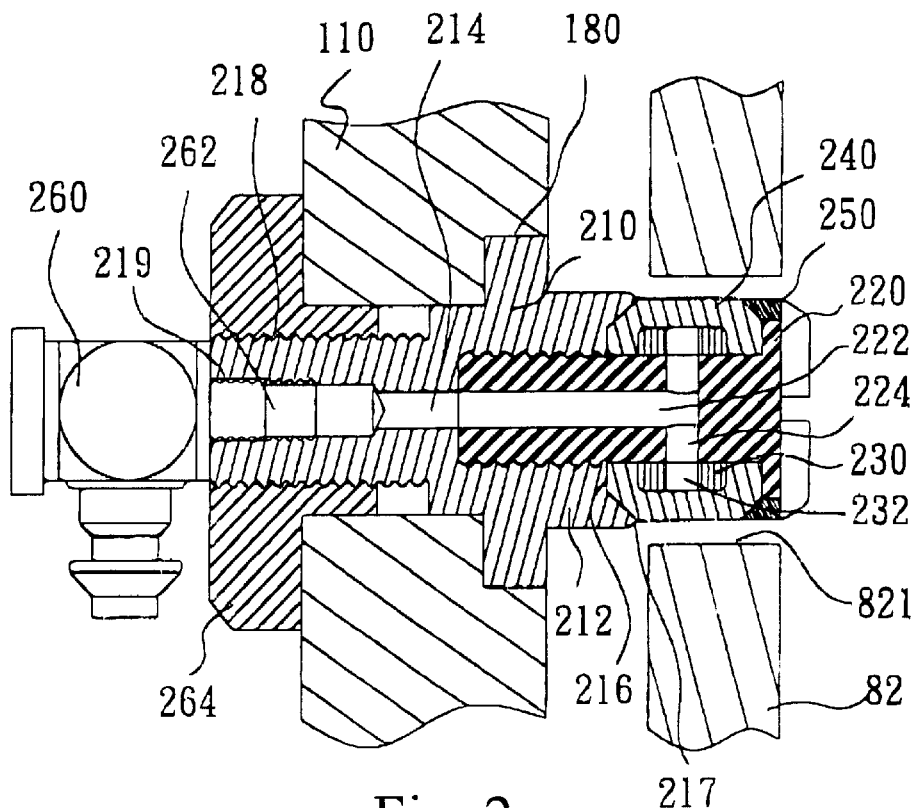
FIG. 2 is a schematic drawing of an unexpanded positioning device inserting a positioning hole of a cover of the unified pod according to the present invention.
Figure 3:
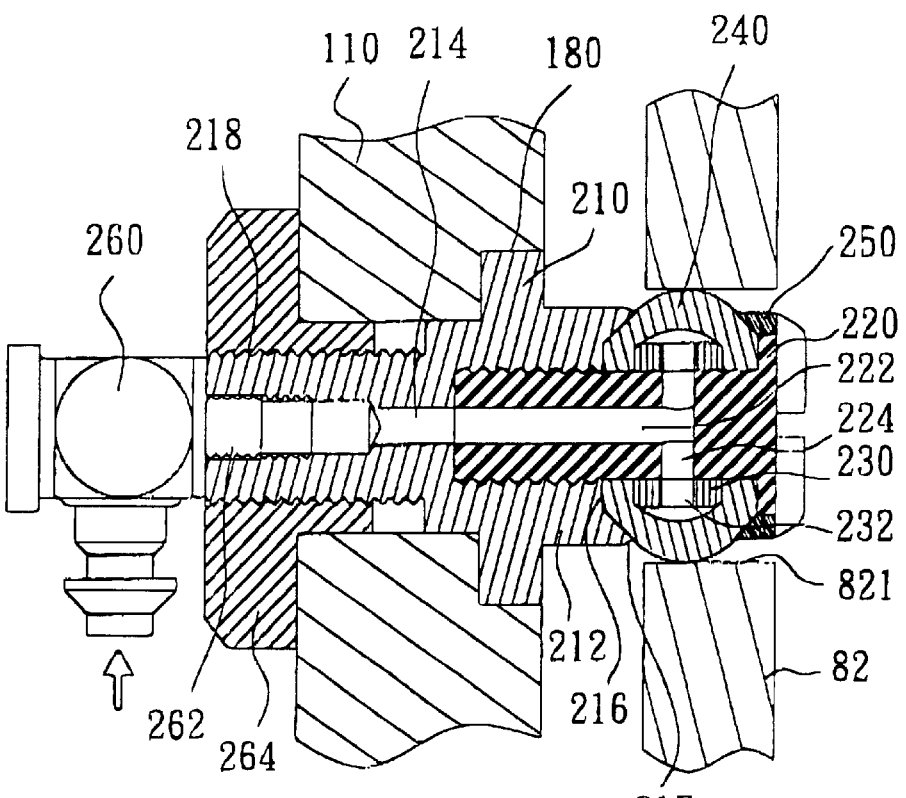
FIG. 3 is a schematic drawing of an unexpanded positioning device inserting a positioning hole of a cover of the unified pod according to the present invention.

Please refer to FIG. 2 and the FIG. 3. FIG. 2 is a schematic drawing of an unexpanded positioning device inserting a positioning hole of a cover of the unified pod according to the present invention. FIG. 3 is a schematic drawing of an expanded positioning device inserting a positioning hole of a cover of the unified pod according to the present invention. In the preferred embodiment of the present invention, the positioning device 200 comprises a seat 210 embedded in a corresponding hole 180 on the interface plate 110. The seat 210 has a portion 212 protruding on the surface of the interface plate 110. Furthermore, the central portion of the seat 210 has a central through hole 214, a fillister 216 positioned at the front end and a threaded end 218. The fillister 216 of the seat 210 is threaded so a fixing screw bolt 220 can be screwed together. One end of the screw bolt 220 protruded on the interface plate 110, the screw bolt 220 has an axial input hole 222 opened at another end, and four radial distributing holes 224 equally opened at its circular surface. A ring-shaped inflatable body 240 made from an expandable elastic material such as engineering rubber encircled around the fixing screw bolt 220. Furthermore, there is a supporting ring 230 between the fixing screw bolt 220 and the inflatable body 240, encircled around the fixing screw bolt 220 and positioned above the radial distributing hole 224, for supporting the inflatable body 240. The supporting ring 230 has four radial inflating holes 232 equally positioned corresponding to the radial distributing hole 224 of the fixing screw bolt 220. A fixing nut 264 is utilized to screw the threaded end 218 of the seat 210 to the interface plate 110. An input end 262 of an input fluid source 260 such as a gaseous pressurization device, is screwed to the seat 210 to connect to the axial input hole 222 of the fixing screw bolt 220 to provide an input fluid. When the inflatable body 240 encircles around the fixing screw bolt 220, a limiting loop 250 is positioned at the front end of the inflatable body 240, for clamping the front end of the inflatable body 240. When the fixing screw bolt 220 is screwed in the fillister 216 of the seat 210, a flange 217 of the seat 210 protruding from the surface of the interface plate is adapted to clamp the back end of the inflatable body 240. Therefore, the inflatable body 240 surrounding the fixing screw bolt 220 forms a self-closed space, to prevent the fluid from leaking.

The assemblage of the positioning device of the preferred embodiment is, first screwing the seat 210 and the fixing nut 264 to the interface plate 110, then encircling the inflatable body 240 around the supporting ring 230 and encircling the limiting loop 250 and the supporting ring 230 around the fixing screw bolt 220, to connect the axial input hole 222 of the fixing screw bolt 220 and the radial inflating holes 232 of the supporting ring 230; then screwing the fixing screw bolt 220 to the fillister 216 of the seat 210, to connect the axial input hole 222 of the fixing screw bolt 220 and the central through hole 214 of the seat 210.

Owing to the front and back two ends of the inflatable body 240 both are clamped to be sealed and forms a cross-section with open-ended rectangular shape around the periphery of the fixing screw bolt 220, when the input fluid source starts to input the fluid, the fluid will flow into the central hole of the seat 210 and the axial input hole 214 of the fixing screw bolt 220, then flow into the radial distributing holes 224 of the fixing screw bolt 220 and the radial inflating holes 232 of the supporting ring 230, finally flow into the inflatable body 240 to expand and generate self-lock effect.

The positioning device of present invention can improve the positioning out come for the cover of the unified pod and hold the cover stably. Therefore, the positioning device of present invention can reduce the obliquity and the abrasion powder between the cover and the unified pod body to reduce the pollution during the wafer manufacturing process.

The invention has been described using exemplary preferred embodiments. However, for those skilled in this field the preferred embodiments can be easily adapted and modified to suit additional applications without departing from the spirit and scope of this invention. Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

Although the present invention has been explained in relation to its preferred embodiment, it is to be understood that many other possible modifications and variations can be made without departing from the spirit and scope of the invention as hereinafter claimed.

What is claimed is:

1. An elastically expandable positioning device protruded on a interface plate of a unified pod loading system, for inserting into a corresponding positioning hole on a unified pod to lock the unified pod and the interface plate together, the positioning device comprising:

a central fastener having one end protruded on the interface plate and an axial input hole opened at another end, and at least one radial distributing hole equally opened at its circular surface;

a ring-shaped inflatable body made from an expandable elastic material;

a supporting ring encircled around the central bolt and positioned above the distributing hole, for supporting the inflatable body, the supporting ring having at least one radial inflating hole equally positioned corresponding to the radial distributing hole of the central bolt; and an input fluid source connected to the axial input hole of the central bolt, for providing an input fluid;

wherein the front and back two ends of the inflatable body both are clamped to be sealed and forms a cross-section with open-ended rectangular shape around the periphery of the central bolt, when the input fluid source starts to input the fluid, the fluid will flow into the axial input hole of the central bolt first and then flow into the radial distributing hole of the central bolt and the radial inflating hole of the supporting ring, finally flow into the inflatable body to expand the inflatable body and then fill up the positioning hole.

2. The positioning device of claim 1 further comprises a seat embedded in a corresponding hole on the interface plate, the seat has a portion protruding from the surface of the interface plate, for clamping the back end of the inflatable body, the central portion of the seat has a central through hole, a fillister positioned at the front end for locking the central bolt, and a threaded end.

3. The positioning device of claim 2 further comprises a limiting loop positioned at the front end of the inflatable body, for clamping the front end of the inflatable body.

4. The positioning device of claim 3, wherein the central fastener is a fixing screw bolt, which can be screwed into the fillister of the seat.

5. The positioning device of claim 1, wherein the inflatable body is made of engineering rubber.

6. The positioning device of claim 1, wherein the fluid is gas such as air or nitrogen.

7. The positioning device of claim 6, wherein the fluid source is a gaseous pressurization device.

8. The positioning device of claim 1, wherein the fluid is liquid such as water or oil.

9. The positioning device of claim 8, wherein the fluid source is a liquid pressurization device.

* * * * *